US005597976A

United States Patent [19]
Schroeder

[11] Patent Number: 5,597,976
[45] Date of Patent: *Jan. 28, 1997

[54] THERMOELECTRIC GENERATOR AND MAGNETIC ENERGY STORAGE UNIT WITH CONTROLLABLE ELECTRIC OUTPUT

[76] Inventor: Jon M. Schroeder, 14301 Bag dad Rd., Leander, Tex. 78641

[ * ] Notice: The term of this patent shall not extend beyond the expiration date of Pat. No. 5,393,350.

[21] Appl. No.: 344,876

[22] Filed: Nov. 25, 1994

Related U.S. Application Data

[63] Continuation-in-part of Ser. No. 133,348, Oct. 8, 1993, Pat. No. 5,393,350.

[51] Int. Cl.[6] .................................................. H01L 35/02
[52] U.S. Cl. .......................... 136/205; 136/208; 136/212; 136/224; 136/242; 310/306; 310/307
[58] Field of Search ...................... 136/200, 205, 136/207, 208, 209, 210, 211, 212, 217, 218, 219, 220, 224, 225, 242; 310/306, 307

[56] References Cited

U.S. PATENT DOCUMENTS

| | | | |
|---|---|---|---|
| 2,390,578 | 12/1945 | Findley | 136/4 |
| 2,410,872 | 11/1946 | Findley | 136/4 |
| 2,415,005 | 1/1947 | Findley | 136/4 |
| 2,425,647 | 8/1947 | Sarver | 171/97 |
| 2,864,879 | 12/1958 | Toulmin, Jr. | 136/4 |
| 2,919,553 | 1/1960 | Fritts | 62/3 |
| 3,090,875 | 5/1963 | Harkness | 310/4 |
| 3,119,939 | 1/1964 | Von Koch | 310/4 |
| 3,326,727 | 6/1967 | Fritts | 136/208 |
| 4,859,250 | 8/1989 | Buist | 136/225 |
| 5,022,928 | 6/1991 | Buist | 136/212 |
| 5,168,118 | 12/1992 | Schroeder | 89/8 |
| 5,393,350 | 2/1995 | Schroeder | 136/205 |

*Primary Examiner*—Charles T. Jordan
*Assistant Examiner*—Chrisman D. Carroll
*Attorney, Agent, or Firm*—Joseph F. Long

[57] ABSTRACT

The invention encompasses a torus formed by heated and cooled junctions of dissimilar metals such as copper and nickel to generate a low voltage current and form an electrical path of greatly enhanced conductivity wherein a greater current flow may be induced to form a stronger magnetic field. Current at higher voltage may be incrementally removed by magnetic field arrangements to act as magnetic variable switches while at the same time the magnetic field is contained and current also flows through the torus.

14 Claims, 4 Drawing Sheets

THERMOELECTRIC GENERATOR AND MAGNETIC ENERGY STORAGE UNIT WITH CONTROLLABLE ELECTRIC OUTPUT

This Invention was made with government support under contract, DASG6O-93-C-0145 awarded by Department of Defense, Ballistic Missile Defense Organization (BMDO), managed by the U.S. Army Space and Strategic Defense Command. The government has certain rights in the invention.

This is C.I.P. of Ser. No. 08/133,348, filed Oct. 8, 1993 and entitled "A thermopile type electromagnetic generating and storage unit", now U.S. Pat. No. 5,393,350.

This invention differs significantly from Schroeder, U.S. Pat. No. 5,168,118 issued Dec. 1, 1992 and from Ser. No. 08/133,348, now U.S. Pat. No. 5,393,350, which is the closest prior art as follows:

a) the copper and nickel segments to produce current by heating and cooling alternate segments are arranged in the form of a torus or a helix in the form of a continous loop to effectively contain the magnetic field;

b) a unique magnetic field arrangement utilizing the Hall effect acts like a variable switch in that variable current may flow to a load through take out leads on either side of the variable switch without interrupting the current flow in the torus. Multiple such variable switches may be used in one torus;

c) a switching control of the variable switch allows energy take out for a very small fraction of a second, thus markedly increasing the utility of this type of energy storage. The take out energy is further controlled by varying the strength of the magnetic field applied to the switch arrangement. When a current carrying conductor is held firmly in a magnetic field the field exerts a sideways force on charges or electrons moving in the conductor creating a potential difference between the two sides of the conductor. This difference of potential produced is called the Hall effect. The magnitude of the potential difference is proportional to the current in the conductor and the strength of magnetic field applied perpendicular to the direction of current flow in the conductor. We calculate that with 50,000 amps circulating in the torus that a one Tesla magnetic field applied perpendicular to current flow will cause a 1600 V potential difference.

BACKGROUND OF THE INVENTION

The variable switch produced by the Hall effect has a significant advantage in that switching may be quite rapid to allow pulsed take out and in that switching the magnetic field polarity produces an alternating current out put. A steady state magnetic field produces a D.C. current output.

We may use a programmable microprocessor to control timing and strength of the magnetic field in the variable switch to control electrical output from the unit. In a preferred type magnetic switch a Colpitts Oscillator with minimum energy input produces the magnetic field to produce the Hall effect to take out energy in the form of alternating current.

The magnetic arrangement to form the variable switch in another embodiment is as follows:

a) using external electromagnets a magnetic field in one of the nickel segments is produced that is at right angles to the current in the torus. Output leads are on either side of this nickel segment. Interaction of the magnetic fields called the Hall Effect causes current flow through the output connections to a load. The output current may be controlled by microprocessor control of current fed to the electromagnets causing the magnetic field in the nickel segment. Switches in the output lines may be controlled with conventional circuitry to operate in conjunction with the variable switch. By proper phasing and by adjusting switching circuitry to the variable switch to operate at one sixtieth of a second the unit can be used to add power to a conventional 60 cycle electrical network.

The magnetic field in the variable switch or switches may automatically be varied with normal circuitry so that electrical draw off to feed into a 60 cycle system is practical. Both A.C. and D.C. current may be drawn off the torus or similar thermopile arrangement at the same time using two variable switch arrangements.

A multiplicity of tori stacked one above the other with output leads connected in parallel may be used to form a large capacity unit in limited space.

The invention is usable for such diverse uses as driving a railgun, levitating a train, furnishing back up power for utility companies, for utility grid diurnal storage for load leveling furnishing and storing localized electrical energy from waste heat or low temperature heat sources and furnishing power to operate an electrically powered automobile, buss, and truck etc.

SUMMARY OF THE INVENTION

The invention comprises:

a) a low voltage generating unit formed by alternate segments of dissimilar metals arranged in the form of helix formed into a loop or torus, with heating and cooling of alternate junctions causing a low voltage but high current flow, current flow being dependent upon temperature differential between alternate junctions, junction area, and size of the unit;

b) a method of sustaining and enhancing current flow by low voltage injection of current by direct connection to a battery or other D.C. source;

c) a magnetically induced variable switch using the Hall effect operable in microseconds allowing energy drawoff without interrupting current flow in the torus; alternatively a knockout switch formed from one segment to give instantaneous complete discharge may be d) output leads on either side of the variable switch or on either side of the knockout switch.

The voltage generated by heating, and cooling junctions of dissimilar metals such as nickel and copper or nickel and aluminum is less than one volt but with properly shaped dissimilar metal segments arranged in a torus fashion with alternate junctions heated and cooled there is a large current flow. With current enhancement or addition a very high current with relatively slow decay rate and producing a high strength magnetic field is possible. Using an iron core inside the torus acts to effectively increase the mount of energy stored in the magnetic field. In the torus or loop shape the magnetic field is contained offering possibilities for use where a normal magnetic field is undesirable. Using the variable switch as described, voltage to drive current flow even into a high voltage load is available. Conventional switching may be used in the leads to the electrical load. In order to return power to a utility grid the microprocessor control of the variable switch could be set to one sixtieth of a second with changing polarity of magnetic field in the switch to produce a normal sinusoidal wave A.C. to feed in phase with the grid circuit. Switching to use the current generated by a collapsing magnetic field to operate a rail gun would be quite simple using a thermoelectric type quick opening or knockout switch alone instead of the variable switch.

In another embodiment two or more tori formed by dissimilar metal segments with provisions for heating and cooling alternate junctions may be placed one above the other with output leads from each torus. With inlet heating and cooling headers and known switching this type unit should produce large mounts of power available for utility back up or load leveling or similar usage.

Preferred construction is of segments of nickel and segments of copper formed to maximize junction area, maximize number of junctions minimize metal usage, maximize electrical conductivity and form heating and cooling passageways to heat and cool alternate junctions.

Usable dissimilar metals include:

nickel with copper, aluminum, brass, iron, silver or gold;

constantan with copper, aluminum, brass iron, silver or gold;

bismuth with copper, aluminum, brass iron, silver or gold; and other metals with similar seeback voltage properties.

In one embodiment air is blown into an air inlet cooling manifold attached to alternate junctions of the torus. The heated air exiting the cooling manifold may be used to supply air to multiple gas burners in an inlet heating manifold connected to heat alternate junctions of the torus. The exit of the heating manifold is connected to a short stack or inlet of a heated air discharge fan to pull heated gas exit the burners through the heated air passageways to heat the alternate junctions of the segmented ting forming the torus. Many other ways of heating and cooling alternate junctions are possible including steam, vaporized gas cooling exhaust gas heating, water cooling etc. The maximum difference in heated and cooled junction temperature is desired.

This invention should allow performance of many functions visualized for cryogenically cooled superconducting materials with possible improvement in energy usage by utilizing waste heat and cooling for the thermopile in a loop or torus shape as compared to cryogenic cooling to produce a superconductive unit.

A magnetically variable switch is formed by inducing a magnetic field at approximately right angles to the current flow in the torus. This may be done as follows:

a) using either microprocessor controlled electromagnets or a Colpitts Oscillator to induce a magnetic field in one of the nickel segments;

b) connecting output connections from either side of the nickel segment or from a copper segment on each side of the nickel segment and leading to the electrical load.

The switch as described utilizes the Hall effect to allow take out of energy from the torus without causing cessation of current flow in the torus.

BRIEF DESCRIPTIONS OF THE DRAWINGS

DETAILED DESCRIPTION OF THE INVENTION

We may best describe the invention from the drawings.

Figure 1:
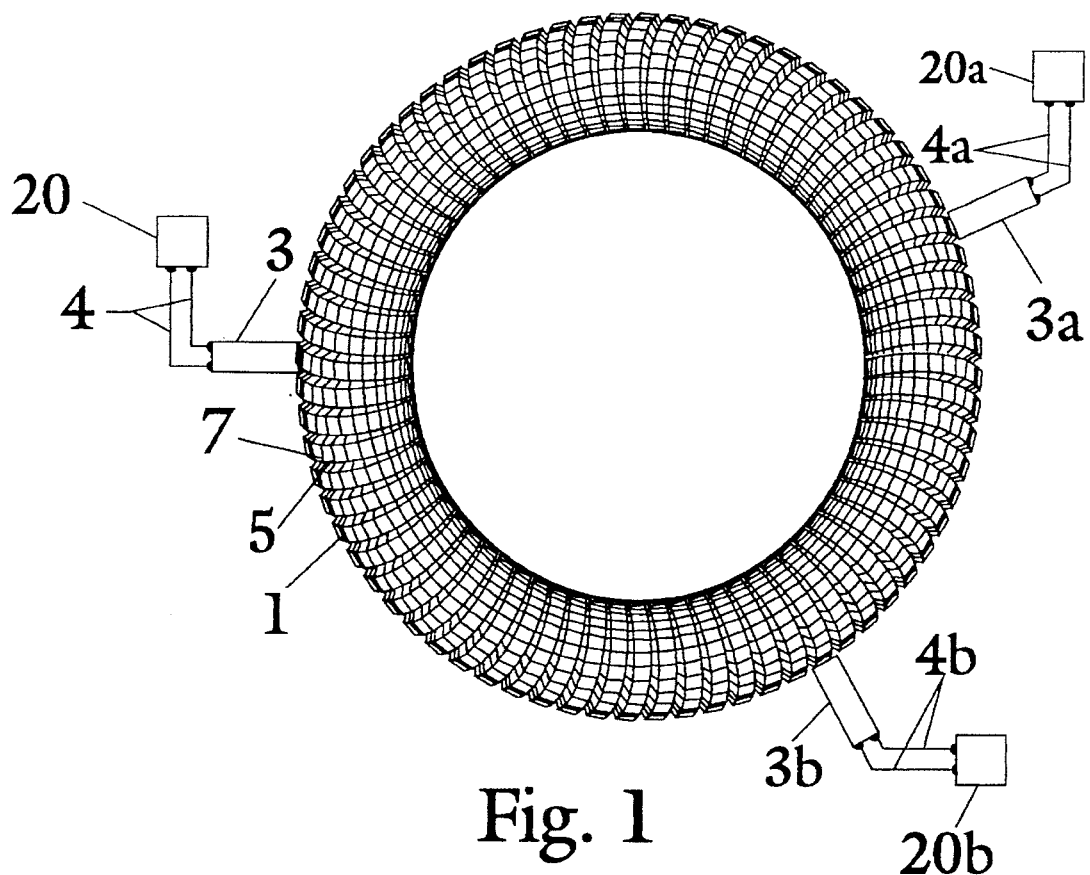
FIG. 1 shows a top view of the torus formed by dissimilar metal segments and magnetically variable switches integrally formed in the unit.

In FIG. 1 we've shown a torus structure 1 composed of segments 5 and segments 7 of dissimilar metals alternating with each other. We've shown switches 3, 3a, and 3b with output leads 4, 4a, and 4b going to lead 20, 20a, and 20b. These are discussed in more detail in FIG. 3, 4, and 6. We've shown three switches to indicate that there could be a multiplicity of switches and loads. In the preferred embodiment segments 5 are copper and segments 7 are nickel.

Figure 2:
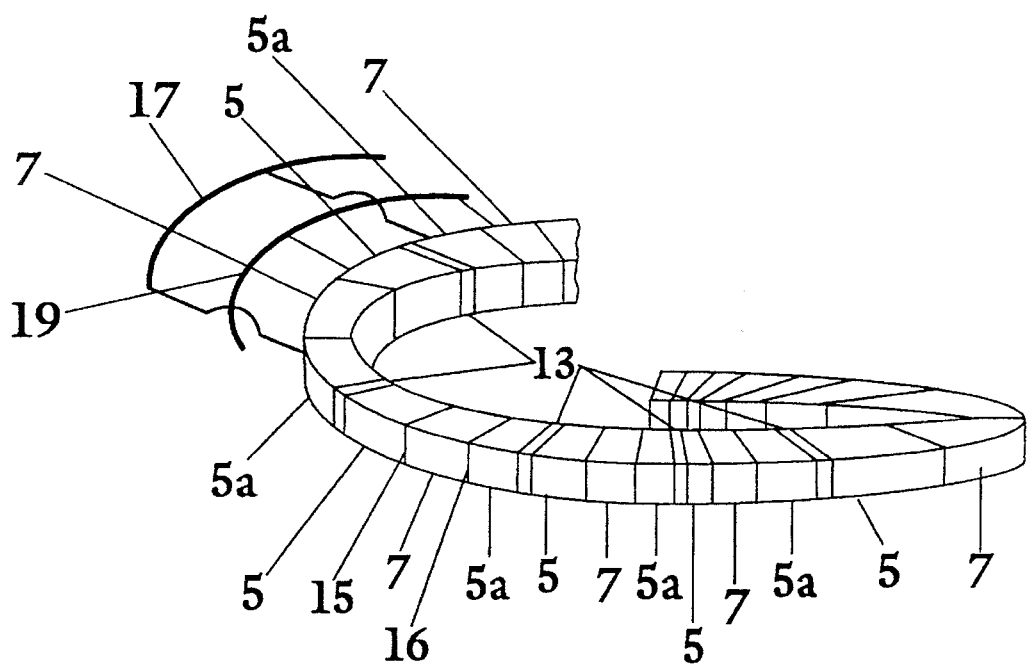
FIG. 2 shows a segment of the torus or helix formed into a loop in block form.
Figure 3:
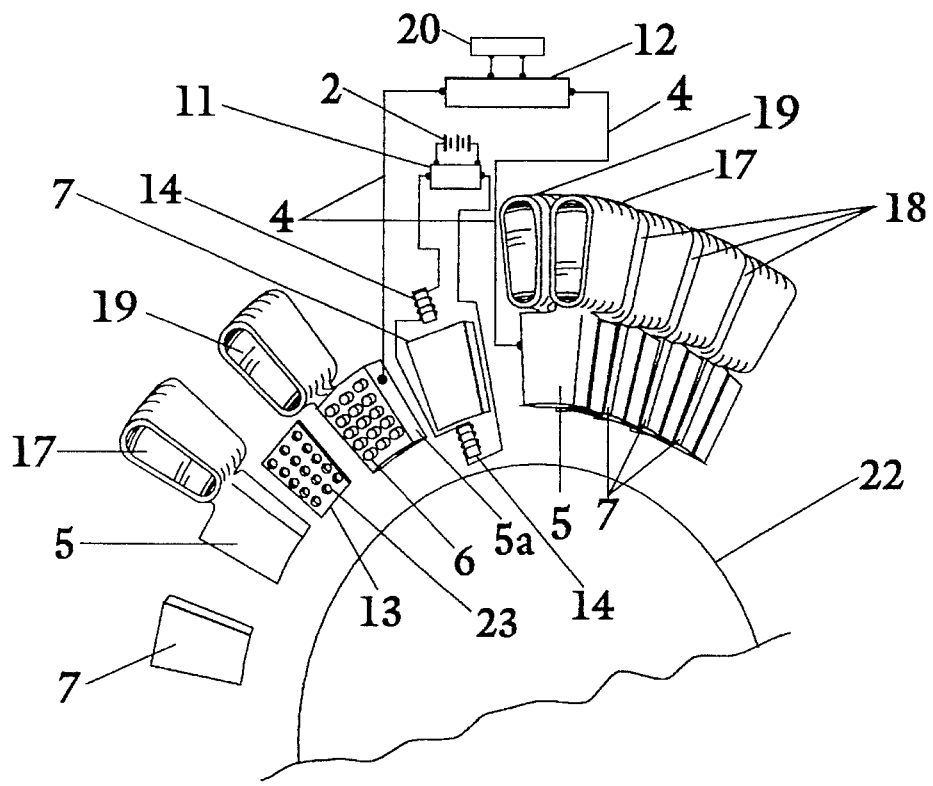
FIG. 3 shows detail of preferred construction of a segment of the torus with a magnetically variable switch.

In FIG. 2 we've shown a section of torus 1 indicating alternating copper segments 5 and 5a with nickel segments 7 with thermal insulators 13 partially separating halves 5 and 5a of each of the copper segments shown in detail on FIG. 3. Junctions 15 and 16 on each side of each nickel segment 7 may be made by conventional methods of brazing welding, etc. For drawing clarity we've shown this for one segment. Since copper is more thermally and electrically conductive than nickel we use greater thickness of copper than nickel in one preferred embodiment. Heating and cooling of junctions is accomplished with side manifolds 17 and 19. Manifold 17 may be heated with circulating or once through gas such as steam or gas exit burners or with heated liquid etc. Manifold 19 may be cooled with refrigerant gas, cooling water or cooling air etc. The engineering choice will depend upon many factors such as site location, water availability etc. Operating in this fashion in some visualized installations with heating fluid to heat the hot junctions and cooling fluid to cool the cold junctions the unit operates as though it were a superconducting ting with low voltage current flow. A maximum temperature difference between junctions of the copper and nickel segments is desired for maximum current production.

Figure 6:
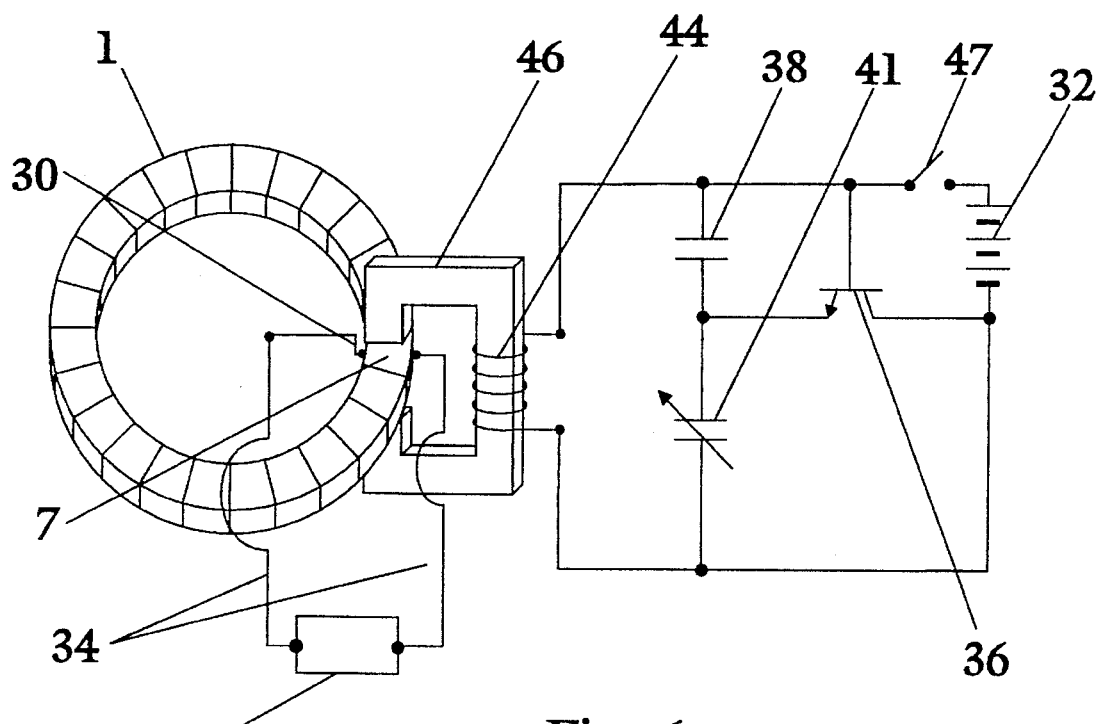
FIG. 6 shows a Colpitts Oscillator for current injection to form a variable switch.

In operation, with a temperature difference between junctions of about 300° C. we calculate from experimental data determined in our laboratory and confirmed and measured by an independent testing agency that with a ting of an internal diameter of 82" inches and an external diameter of 94" and having a rectangular cross section of 6"×8" that a voltage of 0.002 to 0.02 volts and an amperage of 500,000 to 1,000,000 amps will be generated. This flowing current should give a magnetic field of 10 to 20 tesla. By using an internal iron core and adding current by injection as shown in FIG. 6 we calculate that we can increase current flow to give a magnetic field approaching 26 tesla.

FIG. 3 shows details of a portion of the preferred embodiment of torus 1, FIG. 1. A cast thin ceramic thermal insulator 13 with holes 23 partially separate each side of copper segments 5 and 5a to modulate heat flow. As indicated in the exploded view the open portions of segment 5a when attached to other segments of 5a form an open channel or manifold 19 to carry cooling fluid; the segments 5 when attached to each other form an open channel or manifold 17 to carry heating fluid. Electrically insulating gaskets 18 are used between segments forming the heating and cooling manifolds 17 and 19. When top portions of segments 5 and 5a are attached to form heating and cooling manifolds projections 6 on segment 5a protrude through holes 23 of the thermal insulator 13 and solidly contact segment 5 to form a continuous electrical path. A thin braze may be used to improve electrical contact. Flat pieces of nickel 7 may be brazed on either side of dual 5 and 5a segments. In this fashion one side of nickel segment 7 contacts hot copper segment 5 and the other side of the segment 7 contacts the cold copper segment 5a. One nickel segment 7 may be used to form each magnetic switch 3, 3a, 3b FIG. 1 when a magnetic field is induced therein. A controlled current flow may established through induction coils 14 from battery 2 through controller 11. Microprocessor controller 11 may be used to adjust duration and frequency of application of current to induction coils 14. This current flow induces a magnetic field at right angles to the current produced in the torus by heating and cooling alternate junctions of the nickel and copper segments. This magnetic field induced in the nickel segment acts to develop a potential difference across the nickel segment by pushing electron flow to one side of the nickel segment. This effect is known as the Hall effect and allows us to draw off current through leads 4 even though current is still flowing in the torus 1. The strength of the magnetic field applied to the switch determines potential difference or output current flow. Thus magnetic switch 3 can itself be used to vary current draw off and we have chosen to call this a variable switch. With coils 14 activated with D.C. current there will be D.C. current flow through leads 4 when the leads are attached to a load. If a Colpitts Oscillator as shown in FIG. 6 is used to create a changing polarity magnetic field in the segment forming the switch an A.C. current will go through leads 4. In some embodiments leads 4 go to transformer 12 coupled with load 20. Transformers are relatively efficient and low resistance leads to the low voltage side of a high voltage transformer offers an advantage in some applications. The iron core 22 located internally in the torus acts to increase energy stored in the unit.

Figure 4:
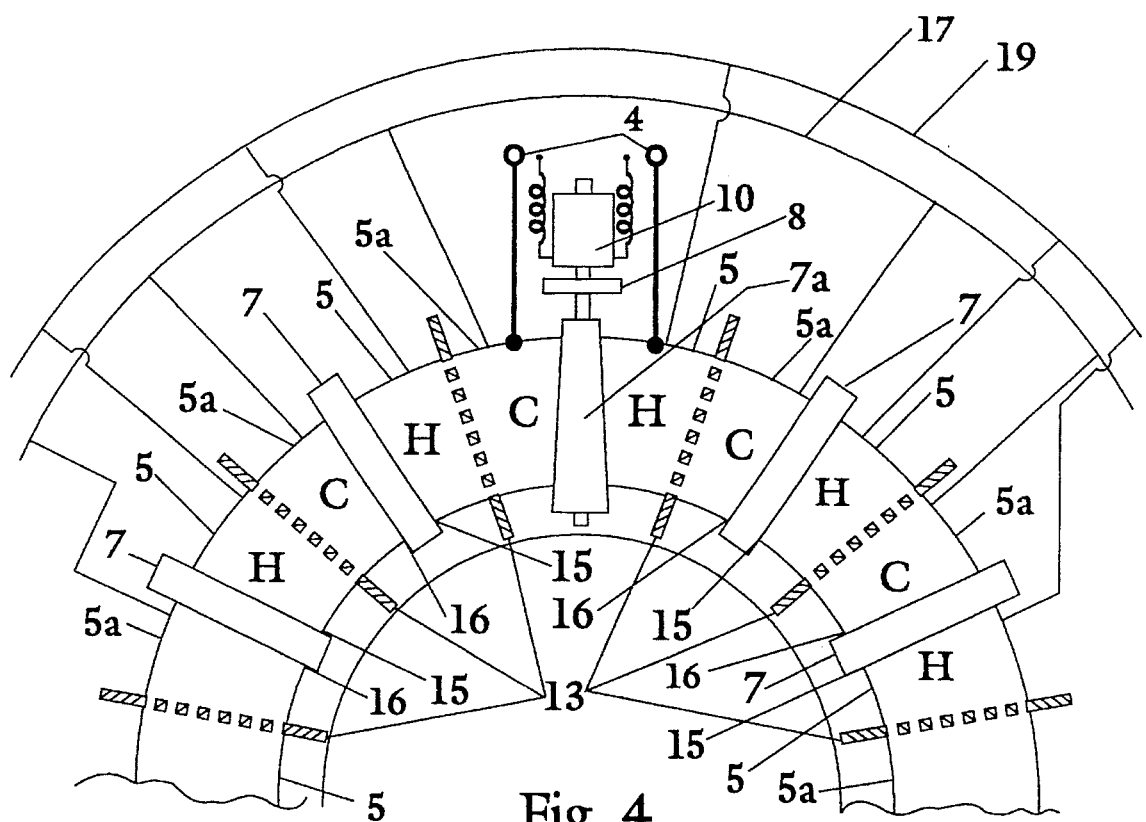
FIG. 4 shows a segment of the torus with a nickel segment that may be knocked out rapidly to form a quick opening thermoelectric switch segment that acts as part of the generating loop when in a closed position.

In FIG. 4 we show a segment of a torus constructed in essentially the same manner as outlined in FIG. 3. For simplicity the heating header 17 and cooling header 19 are shown as lines. Knockout switch 8 is formed from a specially constructed nickel segment 7a that is an integral voltage producing part of the torus. Activation of a solenoid 10 or other drive units including weight driven, explosive driven etc. may be used to drive segment 7a downward in a fraction of a second. Leads 4 may be connected through normal switching to the load. This type switch is an advantage when total discharge of the torus is required—such as used to drive a railgun. As in FIG. 3 we've shown thermal insulators 13 partially between hot and cold segments of copper 5a and 5. These thermal insulators cause a marked decrease in heat flow but with projections 6, FIG. 3 solidly contacting the other copper segment by brazing offer only a minimal resistance to electron flow thereby increasing efficiency of the unit. Nickel segments 7, except for 7a are brazed on either side 15 and 16 to copper segments as indicated.

Figure 5:
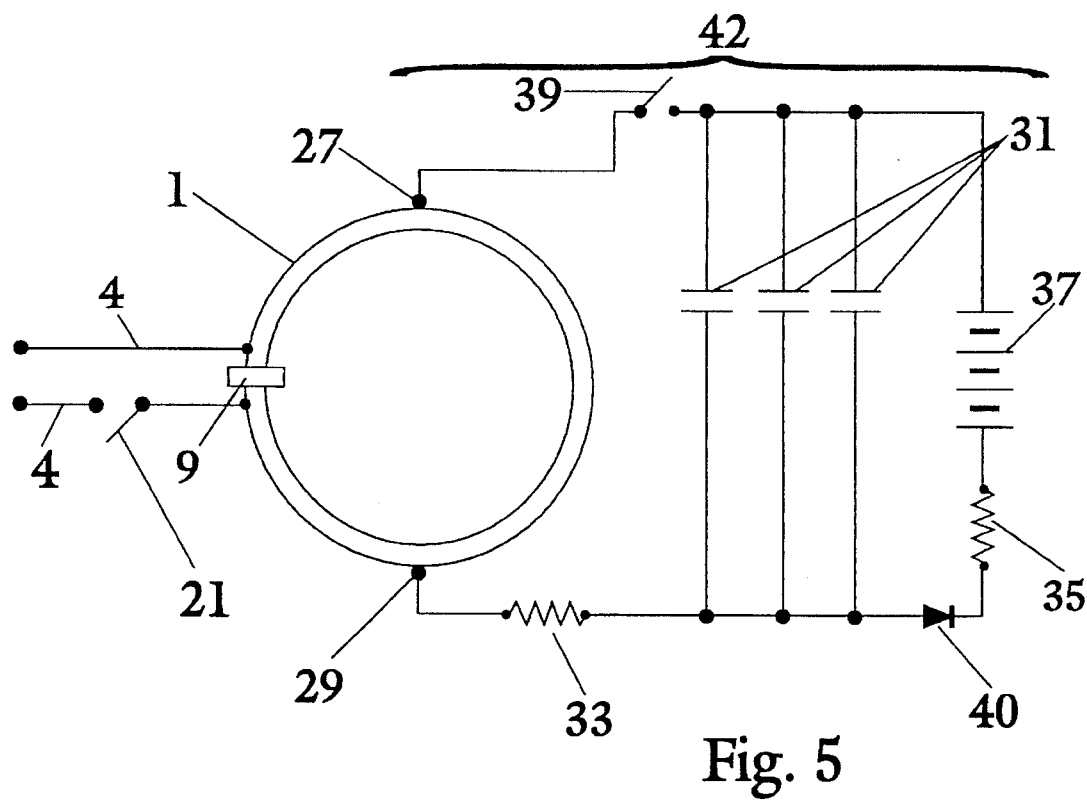
FIG. 5 shows a flux pump for current injection.

In FIG. 5 we've shown a type of flux pump circuit 42 to inject electrons (current) into the circulating electron stream in torus 1 formed by heating and cooling alternate junctions of the dissimilar metals in torus 1 as described. Battery 37 or any other D.C. voltage source will charge capacitors 31 and inject current into torus 1 through connectors 27 and 29 located on opposite sides of the torus when switch 39 is closed. Resistors 33 and 35 and diode 40 modulate the current flow. Switch 39 is pulsed with convential circuitry to cause recharging of capacitors 31 and current injection into torus 1. In this way electron flow in torus 1 is increased with an attendant increase in magnetic field strength. With switch 21 closed opening switch 9 puts current into output leads 34 to load 20. Switch 9 may be similar to switch 8 in FIG. 4 or switch 3, 3a, and 3b in FIG. 1 or switch 30 in FIG. 6. Experimental data, confirmed by an independent laboratory, on a small unit shows apparent electrical conductance of the torus 1 with heated and cooled alternate junctions is 5 to 10,000 times greater than one would expect from either copper or nickel alone. Said another way we were able to achieve orders of magnitude more amperes flowing in the heated and cooled junction torus than would be expected. We do not have a theoretical explanation of why.

Current may be also added into the current circulating in torus 1 by inductance or by use of suitable circuitry and a transformer.

In FIG. 6 we've shown a preferred construction of a magnetic variable switch 30 using one nickel segment 7, FIG. 2. A known Colpitts Oscillator circuit comprising battery 32, transistor 36, fixed capacitor 38 and variable capacitor 41 and switch 47 with induction coil 44 around a C shaped iron core 46 induces a magnetic field in nickel segment 7 at right angles to the electron or current flow through torus or loop 1 as previously described. This produces a voltage drop known as the Hall Effect between the two leads 34 when one lead of the two leads is connected on each of two sides of nickel segment 7. This voltage drop produces current flow through leads 34 to load 20.

The output current flow may be adjusted using variable capacitor 41 to be 60 cycle or greater frequency. Operation of the Colpitts Oscillator with the iron core 46 produces a sinusoidal out put current. The frequency may be varied to be other than 60 cycle using variable capacitor 41. This type switch 30 which utilizes the Hall effect in the same manner as in switches 3, 3a, and 3b, in FIG. 1 consumes little energy and is preferred when draw of A.C. power only is desired.

Figure 7:
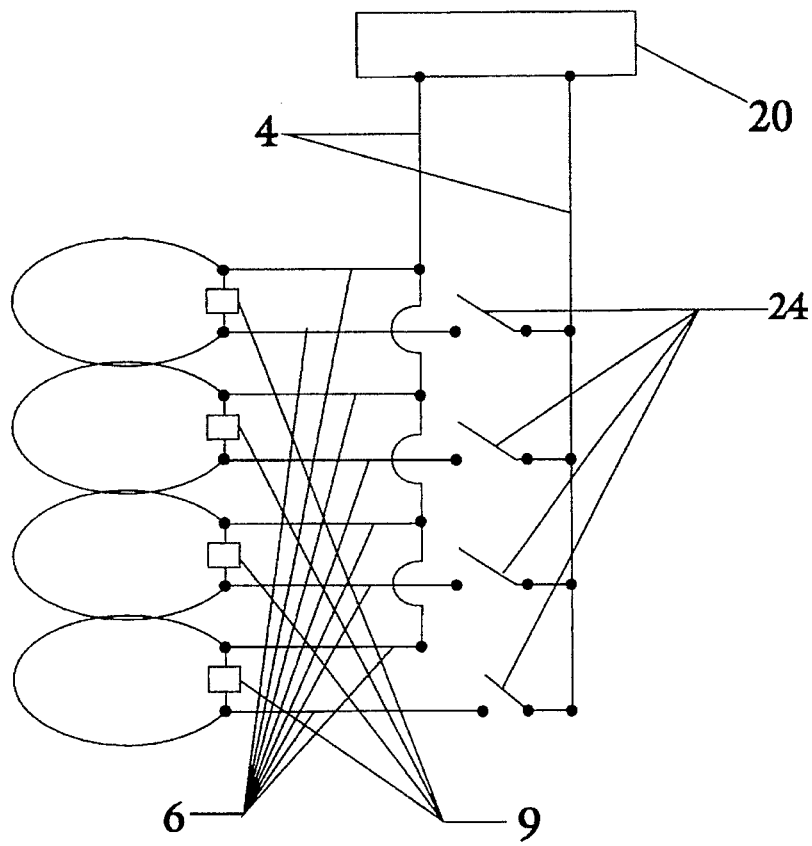
FIG. 7 shows multiple tori to produce a high capacity unit.

FIG. 7 shows an embodiment wherein multiple tori fabricated of segments of dissimilar metals and heated and cooled as previously outlined are placed one above the other and connected to output leads 4 attached to load 20 through individual leads 6 and switches 24. This allows for a large storage unit on minimal floor space and incremental withdrawal of current from one torus at a time by operating one of individuals switches 24 in cooperation with one of switches 9 which may be either a knockout switch 8 in FIG. 4, or variable switches 3, 3a, 3b and in FIG. 1. All switches may be microprocessor controlled to open and close at desired intervals with one or more being opened simultaneously to vary the amount of current withdrawn.

Figure 8:
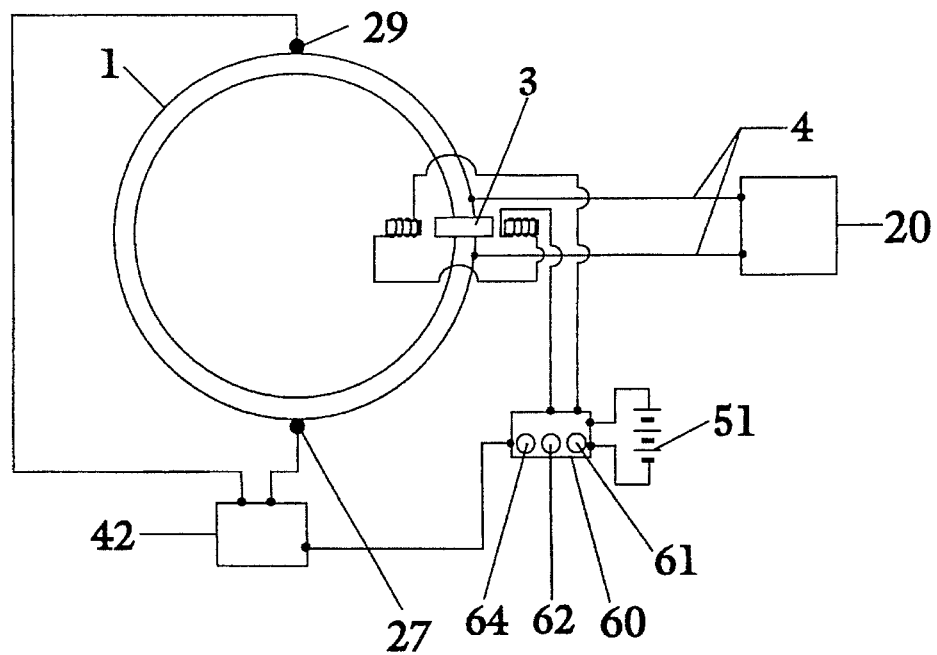
FIG. 8 shows electrical circuitry.

In FIG. 8 we show electrical circuitry for operation of torus 1 with one type switch. Flux pump circuitry 42, previously described in FIG. 5 may add current to torus 1 through connections 27 and 29 when switch 39 FIG. 5 in circuitry 42 is rapidly opened and closed. Switch 39 in circuitry 42 is adjustably controlled by element 61 in microprocessor 60 to add current through connectors 27 and 29. Variable switch 3 or other switches as described cause sufficient voltage to drive current through output leads 4 to load 20. Microprocessor 60 powered by battery 51 has resettable interval control 64 and resettable times duration controls 62 to vary interval frequency and duration of magnetic field in magnetic switch 3, 3a, 3b to allow variation in frequency and amount of current withdrawal from torus 1.

What is claimed is:

1. A thermoelectric generator and magnetic energy storage unit with controllable electric output comprising:
   a) two dissimilar metal segments means joined to form a helix in a continuous loop in said unit,
   b) a heating and cooling means to heat and cool alternate junctions of said metal segments means, thereby causing current flow and generation of a first magnetic field contained in said continuous loop;
   c) a flux pump means with connections to said continuous loop to inject additional current into said current flow thereby increasing strength of said first magnetic field in said unit;
   d) a switching means and output connection means located in said continuous loop with said output connection means located on either side of said switching means with said switching means controllably operable in fractions of a second and operating to discharge current into said output connections when said output connections are electrically connected to a load.

2. A thermoelectric generator and magnetic energy storage unit with controllable electric output as in claim 1 wherein said switching means comprises one of said segments in said continuous loop with means to induce a second magnetic field in said one of said segments at right angles to said current flow in said continuous loop thereby causing a potential difference across said segment, said potential difference may be varied by varying said second magnetic field thereby allowing withdrawal of a variable amount of energy through said output connections.

3. A thermoelectric generator and magnetic energy storage unit with controllable electric output as in claim 1 wherein said output connection means from each of a multiplicity of said continuous loops are connected together to form said unit.

4. A thermoelectric generator and magnetic energy storage unit with controllable electric output as in claim 2 wherein said means to induce said second magnetic field in said segment is microprocessor controlled.

5. A thermoelectric generator and magnetic energy storage unit with controllable electric output as in claim 1 wherein said two dissimilar metal segment means are nickel and copper.

6. A thermoelectric generator and magnetic energy storage unit with controllable electric output comprising:
   a) two dissimilar metal segment means consisting of copper and nickel metallically joined to form alternate junctions and to form a minimum of one continuous loop in a torus shape and with open projections from said dissimilar segment means shaped to form a continuous heating channel means and a continuous cooling channel means, with electrical insulation between parts of said segments forming said heating channel means and said cooling channel means;
   b) a heating and cooling means in said continuous channel means to heat and cool alternate ones of said junctions formed, thereby causing current to flow and generate a magnetic field in said unit;
   c) a flux pump means with connections to inject additional current into said current flow thereby increasing the strength of said magnetic field and said magnetic energy storage capacity;
   d) a means for instantaneously and controllably electrically disconnecting one of said segments in said loop;
   f) output leads located one either side of said means for electrically disconnecting said one of said segments;
   g) a control means to control said means for electrically disconnecting said one of said segments and for operating switches in said output leads.

7. A thermoelectric generator and magnetic energy storage unit with controllable electric output as in claim 1 wherein a first one of said two dissimilar metal segments is chosen from a group comprising copper, aluminum, brass, iron, silver and gold and a second one of said two dissimilar metals is chosen from a group comprising nickel, constantan and bismuth.

8. A thermoelectric generator and magnetic energy storage unit with controllable electric output as in claim 1 wherein an iron core means placed inside said segments to form said helix in said continuous loop acts to allow an increase in energy stored in said continuous loop when said segments are alternately heated and cooled and said flux pump means injects additional current into said loop.

9. A thermoelectric generator and magnetic energy storage unit with controllable electric output as in claim 5 further comprising a perforated ceramic thermal insulation means acting to thermally partially separate each half of each of said copper segment means to reduce heat flow and offer minimal resistance to electrical flow.

10. A thermoelectric generator and magnetic energy storage unit with controllable electric output as in claim 6 wherein said means for electrically disconnecting said one of said segments comprises one of said nickel segment means producing current flow and an integral part of said torus but modified to have a nickel plug separating two halves of said one of said nickel segment means, said nickel plug being removable by impact from a solenoid arrangement.

11. A thermoelectric generator and magnetic energy storage unit with controllable electric output comprising:
   a) a copper segment means and a nickel segment means conductively joined to form alternate junctions and to form a minimum of one torus and with said copper segment means and said nickel segment means shaped to form a continuous heating channel means and a continuous cooling channel means with electrical insulation between parts of said segments forming said heating channel means and said cooling channel means;
   b) a heating and cooling means in said continuous channel means to heat and cool said alternate junctions formed; thereby causing current flow and generate a magnetic field in said unit;
   c) a flux pump means with connections to inject additional current into said current flow thereby increasing the strength of said magnetic field and said magnetic energy storage capacity;
   d) a minimum of one of a first type variable switch means to withdraw alternating current from said torus;
   e) a minimum of one of a second type variable switch means to withdraw direct current from said torus;
   f) output leads located one either side of each of said switch means;
   g) a control means to control activation of each of said first type and said second type partial switch means and for operating switches in said output leads.

12. A thermoelectric generator and magnetic energy storage unit with controllable electric output as in claim 11 wherein said first type variable switch means is a Colpitts Oscillator means acting to impress a controllable strength magnetic field of changing polarity across one of said nickel segments at right angles to said current flow in said torus thereby producing an alternating current through said output leads when said output leads are connected to a load.

13. A thermoelectric generator and magnetic energy storage unit with controllable electric output as in claim 11 wherein said second type variable switch means comprises a controllable circuit means acting to impress a controllable strength magnetic field of continuous non-changing polarity across one of said nickel segments at right angles to said current flow in said torus thereby producing said direct current to flow through said output leads when said output leads are connected to a load.

14. A thermoelectric generator and magnetic energy storage unit with controllable electric output comprising:
   a) a multiplicity of tori each formed of two dissimilar metal segment means joined to form alternate junctions;
   b) a heating and cooling means to heat and cool said alternate junctions of said segments; thereby causing current flow and generation of a first magnetic field contained in each of said tori;
   c) a flux pump means with connections to each of said tori to inject additional current into said current flow thereby increasing strength of said first magnetic field in said unit;
   d) a switching means and output connection means located in each of said tori with said output connection means located on either side of said switching means, said switching means being controllably operable in fractions of a second and operating to discharge current into said output connections when said output connections are electrically connected to a load.

* * * * *